United States Patent
Park et al.

(10) Patent No.: US 12,507,348 B2
(45) Date of Patent: Dec. 23, 2025

(54) CIRCUIT BOARD AND MANUFACTURING METHOD THEREOF

(71) Applicant: SAMSUNG ELECTRO-MECHANICS CO., LTD., Suwon-si (KR)

(72) Inventors: Jesang Park, Suwon-si (KR); Changgun Oh, Suwon-si (KR); Yangje Lee, Suwon-si (KR); Hyun Kyung Park, Suwon-si (KR)

(73) Assignee: SAMSUNG ELECTRO-MECHANICS CO., LTD., Suwon-si (KR)

(*) Notice: Subject to any disclaimer, the term of this patent is extended or adjusted under 35 U.S.C. 154(b) by 193 days.

(21) Appl. No.: 18/382,278

(22) Filed: Oct. 20, 2023

(65) Prior Publication Data

US 2024/0268034 A1  Aug. 8, 2024

(30) Foreign Application Priority Data

Feb. 6, 2023  (KR) .................. 10-2023-0015439

(51) Int. Cl.
H05K 3/46 (2006.01)
H05K 1/03 (2006.01)
H05K 3/10 (2006.01)

(52) U.S. Cl.
CPC .......... *H05K 3/103* (2013.01); *H05K 1/0306* (2013.01); *H05K 3/4697* (2013.01); *H05K 2201/0212* (2013.01); *H05K 2201/0753* (2013.01); *H05K 2201/099* (2013.01); *H05K 2201/10204* (2013.01); *H05K 2203/0186* (2013.01); *H05K 2203/1377* (2013.01)

(58) Field of Classification Search
CPC ............... H05K 3/4697; H05K 1/0298; H05K 2201/0753
See application file for complete search history.

(56) References Cited

U.S. PATENT DOCUMENTS

| | | | |
|---|---|---|---|
| 10,939,556 B1* | 3/2021 | Sim ..................... | H05K 1/186 |
| 2017/0094797 A1* | 3/2017 | Baek .................... | H05K 3/4697 |
| 2017/0372980 A1* | 12/2017 | Kurahashi ............ | H05K 3/4602 |
| 2022/0304147 A1* | 9/2022 | Kim ..................... | H05K 1/0296 |

FOREIGN PATENT DOCUMENTS

| | | |
|---|---|---|
| JP | 4940124 B2 | 5/2012 |
| JP | 2022-045241 A | 3/2022 |
| WO | 2016/107649 A1 | 7/2016 |

* cited by examiner

*Primary Examiner* — Sherman Ng
(74) *Attorney, Agent, or Firm* — Morgan Lewis & Bockius LLP

(57) ABSTRACT

A circuit board according to an embodiment includes: a first insulation layer, a first circuit wire that is disposed on the first insulation layer, a second insulation layer that covers the first insulation layer and the first circuit wire, and includes a material that is different from that of the first insulation layer, and a third insulation layer that is disposed on the second insulation layer and includes a cavity. A bottom surface of the cavity is a top surface of the second insulation layer.

9 Claims, 9 Drawing Sheets

CIRCUIT BOARD AND MANUFACTURING METHOD THEREOF

CROSS-REFERENCE TO RELATED APPLICATION

This application claims priority to and the benefit of Korean Patent Application No. 10-2023-0015439 filed in the Korean Intellectual Property Office on Feb. 6, 2023, the entire contents of which are incorporated herein by reference.

TECHNICAL FIELD

The present disclosure relates to a circuit board and a manufacturing method thereof.

BACKGROUND

With the recent advent of the 5G era, an antenna substrate including a circuit board is being used to reduce the size of antennas and improve the performance of antennas. In order to improve the performance of the antenna substrate, a thickness of an insulation layer between a patch antenna and ground plays an important role. Since a dielectric constant of the insulation layer used in the antenna substrate is approximately 3 to 4, the number of insulation layers should be 14 to 16 to ensure good performance. Therefore, since it takes a long time to manufacture an antenna substrate, an antenna module bonding two antenna substrates with a solder ball has been recently developed.

However, since the thickness of an antenna module in which two antenna substrates are bonded with a solder ball increases, a cavity is formed in one antenna substrate, and a passive device such as a multi-layer ceramic capacitor (MLCC) may be formed inside the cavity.

Such a cavity may be directly formed on the antenna substrate using a laser drilling method, or may be formed through a laser drill trimming method using a dry film resist (DFR) as a release layer. However, since the laser drilling method requires forming a cavity on a front surface of the insulation layer of the antenna substrate using a laser beam, the manufacturing time is increased and productivity is decreased. In addition, in the laser drill trimming method, it is difficult for the dry film resist (DFR) used as a release layer to act as an anti-etching layer during laser beam processing, it is difficult to separate a part of the trimmed insulation layer neatly, and it is also difficult to cleanly remove the residual dry film resist.

SUMMARY

Embodiments are to provide a circuit board that can easily form a cavity in an insulation layer and a manufacturing method thereof.

However, the problem to be solved by the embodiments may be variously extended in the range of technical ideas included in the embodiments without being limited to the above-described problems.

A circuit board according to an embodiment includes: a first insulation layer; a first circuit wire that is disposed on the first insulation layer; a second insulation layer that covers the first insulation layer and the first circuit wire, and includes a material that is different from that of the first insulation layer; and a third insulation layer that is disposed on the second insulation layer and includes a cavity. A bottom surface of the cavity is a top surface of the second insulation layer.

The third insulation layer may include a plurality of layers. The circuit board according to the embodiment further includes a second circuit wire that is disposed between the plurality of layers of the third insulation layer.

The cavity may include: a first cavity portion that is adjacent to the second insulation layer; and a second cavity portion that communicates with the first cavity portion and is disposed on the first cavity portion, and the first cavity portion may be wider than the second cavity portion.

The plurality of third insulation layers may include a lower insulation layer that is in contact with the second insulation layer and includes the first cavity and a portion of the second cavity, and at least one upper insulation layer that is disposed on the lower insulation layer and includes another portion of the second cavity.

The second circuit wire may be spaced apart from an interface between the second insulating layer and the lower insulating layer.

The circuit board of further includes a solder resist layer that is disposed on the third insulation layer, wherein the solder resist layer may include a first opening overlapping the second circuit wire and a second opening overlapping the cavity.

A width of the second opening may be greater than a width of the second cavity.

The third insulation layer may include a plurality of layers having the same material as the first insulation layer.

The first insulation layer and the third insulation layer may include prepregs, and the second insulation layer may contain a resin that does not contain glass fibers.

A sidewall and the bottom surface of the cavity may include only an insulating material.

In addition, a manufacturing method of a circuit board according to an embodiment includes: forming a first circuit wire on a first insulation layer; forming a mask layer that includes a second insulation layer covering the first circuit wire and a conductive layer disposed on the second insulation layer; forming an anti-etching layer by etching a part of the conductive layer of the mask layer; forming a third insulation layer that covers the anti-etching layer; forming a second circuit wire on the third insulation layer; and forming a cavity by removing a portion containing the anti-etching layer and the dummy wire from the third insulation layer.

The conductive layer may include a first conductive layer disposed on the second insulation layer, a second conductive layer disposed on the first conductive layer, and a release layer disposed between the first conductive layer and the second conductive layer, and the forming the anti-etching layer may include forming a first conductive member, a second conductive member, and a release member by etching the first conductive layer, the second conductive layer, and the release layer.

The second conductive layer may be formed thicker than the first conductive layer.

The forming the cavity may include: forming a cutout that penetrates the third insulation layer using a laser processing process; forming a cavity block separated from the third insulation layer by inflowing a first etching liquid through the cutout using an etching process; and removing the cavity block.

The forming the cavity block may include separating the first conductive member and the second conductive member by inflowing the first etching liquid to remove the release member.

The manufacturing method of the circuit board may further include removing the first conductive member that covers the second insulation layer using a second etching liquid.

The forming the cavity block may include removing the anti-etching layer by inflowing the etching solution.

The cutout may expose a portion of the anti-etching layer.

The cutout may be spaced apart from an edge of the anti-etching layer.

The manufacturing method of the circuit board may further include forming a dummy wire on the third insulation layer to overlap the anti-etching layer when forming the second circuit wire.

According to the embodiments, the anti-etching layer is formed for preventing excessive processing of the insulation layer by a laser beam, and a cavity is formed using a cutout formed in the insulation layer using a laser beam, thereby improving productivity rather than forming a cavity in the insulation layer using only the laser beam.

In addition, since the anti-etching layer is completely removed using an etching liquid, no residue is left, and the cavity can be formed neatly and easily.

However, it is clear that the effects of the embodiments are not limited to the above-described effects, and can be variously extended within a range that does not deviate from the spirit and region of the present disclosure.

DETAILED DESCRIPTION OF THE EMBODIMENTS

Figure 1:
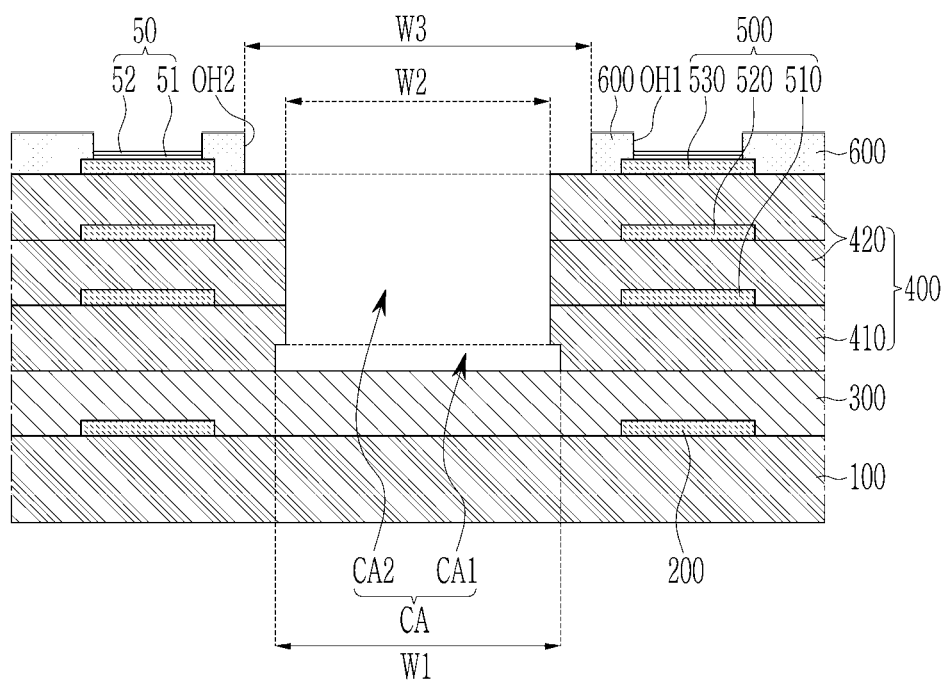
FIG. 1 is a cross-sectional view of a circuit board according to an embodiment.

Hereinafter, with reference to accompanying drawings, various embodiments of the present disclosure will be described in detail and thus a person of an ordinary skill can easily practice them in the technical field to which the present disclosure belongs. The present disclosure may be embodied in many different forms and is not limited to the embodiments described herein.

In order to clearly explain the present disclosure, parts irrelevant to the description have been omitted, and the same reference numerals should be attached to the same or similar constituent elements throughout the specification.

The accompanying drawing is only for easy understanding of the embodiments disclosed in this specification, and the technical idea disclosed in this specification is not limited by the accompanying drawing, and it should be understood that all changes, equivalents, or substitutes included in the spirit and scope of the present disclosure are included.

In addition, since the size and thickness of each component shown in the drawing are arbitrarily indicated for better understanding and ease of description, the present disclosure is not necessarily limited to the illustrated drawings. In the drawings, the thickness of layers, films, panels, regions, etc., are exaggerated for clarity. In the drawings, the thickness of layers, films, panels, regions, and the like are exaggerated for clarity.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, throughout the specification, the word "on" a referential portion will be understood to mean positioned above or below the referential portion, and will not necessarily be understood to mean positioned "at an upper side" based on an opposite to gravity direction.

In addition, unless explicitly described to the contrary, the word "comprise", and variations such as "comprises" or "comprising" will be understood to imply the inclusion of stated elements but not the exclusion of any other elements.

Further, throughout the specification, the phrase "on a plane" means viewing a target portion from the top, and the phrase "on a cross-section" means viewing a cross-section formed by vertically cutting a target portion from the side.

In addition, when "connected to" in the entire specification, this does not only mean that two or more constituent elements are directly connected, but also means that two or more constituent elements are indirectly connected, physically connected, and electrically connected through other constituent elements, or being referred to by different names depending on the position or function, while being integral.

Hereinafter, various embodiments and variations will be described with reference to the accompanying drawings.

Referring to FIG. 1, a circuit board according to an embodiment will be described.

FIG. 1 is a cross-sectional view of a circuit board according to an embodiment.

As shown in FIG. 1, a circuit board according to an embodiment includes a first insulation layer 100, a first circuit wire 200, a second insulation layer 300, a plurality of third insulation layers 400, a plurality of second circuit wires 500, and a solder resist layer 600.

The first insulation layer 100 may include a thermosetting resin such as an epoxy resin or polyimide, or a thermal baking resin such as polyethylene (PE), polycarbonate (PC), or polyvinyl chloride (PVC). For example, the first insulation layer 110 may include a prepreg.

The first circuit wire 200 may be disposed over the first insulation layer 100. The first circuit wire 200 may transmit an electrical signal. The first circuit wire 200 may be disposed in various patterns. The first circuit wire 200 may include a conductive material such as copper (Cu), aluminum (Al), silver (Ag), tin (Sn), gold (Au), nickel (Ni), lead (Pb), titanium (Ti), or their alloys.

The second insulation layer 300 covers the first insulation layer 100 and the first circuit wire 200, and may include a different material from that of the first insulation layer 100. For example, the second insulation layer 300 may be made of a resin that does not contain glass fibers.

The third insulation layer 400 is disposed on the second insulation layer 300 and may have a cavity CA. The cavity CA may include a first cavity portion CA1 and a second cavity CA2. The third insulation layer 400 may include the same material as the first insulation layer 100. For example, the third insulation layer 400 may include prepregs.

The third insulation layer 400 may include a lower insulation layer 410, and at least one upper insulation layer 420.

The lower insulation layer 410 is in contact with the second insulation layer 300 and may have a first cavity portion CA1 and a portion of the second cavity CA2. The lower insulation layer 410 may not cover the second circuit wire 500. That is, the lower insulation layer 410 may not include the second circuit wire 500 therein. For example, a circuit wire may not be disposed between the lower insulation layer 410 and the second insulation layer 300.

The upper insulation layer 420 is disposed above the lower insulation layer 410 and may have a second cavity CA2. The first cavity portion CA1 may be formed adjacent to the second insulation layer 300. That is, the bottom surface of the first cavity portion CA1 may be a top surface of the second insulation layer 300.

The second cavity CA2 communicates with first cavity CA1 and may be disposed above the first cavity CA1.

Here, a width W1 of the first cavity CA1 may be wider than a width W2 of the second cavity CA2.

In the present embodiment, two upper insulation layers 420 are stacked, but it is not limited thereto, and various numbers of upper insulation layers 420 may be stacked.

As such, since the circuit board according to an embodiment has a cavity, a thickness of the entire antenna module may be reduced by disposing passive elements such as a multi-layer ceramic capacitor (MLCC) inside the cavity. In addition, by disposing the passive element in the cavity, the passive element and an IC chip may be disposed on the top and bottom of the circuit board without disposing on the same plane, and thus a planar size of the entire antenna module can be minimized.

The plurality of second circuit wires 500 may be disposed between a plurality of third insulation layers 410 and 420 or above the third insulation layer 420 at the top. That is, some of the second circuit wires 510 and 520 may be disposed between the vertically adjacent third insulation layers 410 and 420, and the uppermost second circuit wire 530 may be disposed on the uppermost third insulation layer 420.

The second circuit wire 500 transmits an electrical signal and may be disposed in various patterns. The second circuit wire 500 may include copper (Cu), aluminum (Al), silver (Ag), tin (Sn), gold (Au), nickel (Ni), lead (Pb), titanium (Ti), or their alloys.

A solder resist layer 600 may be disposed on the third insulation layer 400. The solder resist layer 600 may include an insulation material such as a solder resist.

The solder resist layer 600 may have a first opening OH1 overlapping the second circuit wire 500, and a second opening OH2 overlapping the cavity CA.

Here, a width W3 of the second opening OH2 may be greater than the width W2 of the second cavity CA2.

The uppermost second circuit wire 530 is exposed to the outside by the first opening and may be used as a conductive pad 530 in contact with a solder ball (not shown). An auxiliary pad 50 formed by a plating process, which is a surface treatment process, may be disposed on the conductive pad 530. The auxiliary pad 50 may include a lower auxiliary layer 51 and an upper auxiliary layer 52. The upper auxiliary layer 52 is disposed on the lower auxiliary layer 51. The lower auxiliary layer 51 may include nickel (Ni), palladium (Pd), and the like, and the upper auxiliary layer 52 may include gold (Au).

Next, referring to FIG. 1 and FIG. 2 to FIG. 9, a manufacturing method of a circuit board according to an embodiment will be described in detail.

FIG. 2 to FIG. 8 are cross-sectional views of a manufacturing method of a circuit board according to an embodiment.

Figure 2:
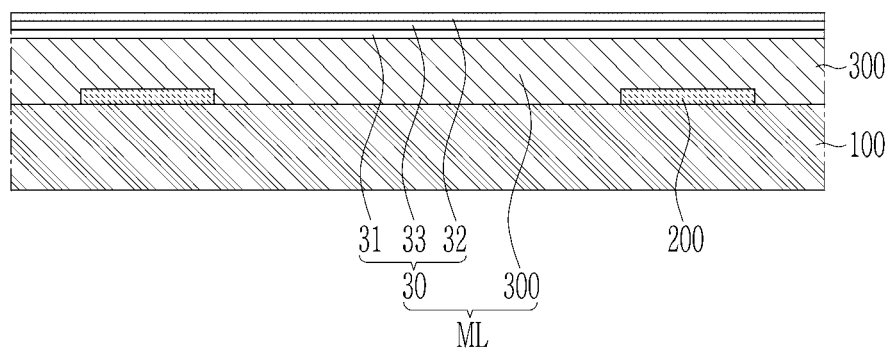
FIG. 2 to FIG. 8 are cross-sectional views of a manufacturing method of a circuit board according to an embodiment.

As shown in FIG. 2, the first circuit wire 200 is formed on the first insulation layer 100.

Then, a mask layer ML covering the first circuit wire 200 is formed. The mask layer ML may include a second insulation layer 300 covering the first circuit wire 200, and a conductive layer 30 disposed on the second insulation layer 300. The conductive layer 30 may include a first conductive layer 31 disposed on the second insulation layer 300, a second conductive layer 32 disposed on the first conductive layer 31, and a release layer 33 disposed between the first conductive layer 31 and the second conductive layer 32.

For example, the mask layer ML may be resin coated copper (RCC), and may be formed by forming a release layer 33 having a thickness of about 18 μm on the second insulation layer 300 that is formed of resin that does not contain glass fibers and serving as a carrier, and forming an ultra-thin first conductive layer 31 having a thickness of about 1.5 μm on the release layer 33. Here, the second conductive layer 32 may be formed to be thicker than the first conductive layer 31, and the first conductive layer 31 and the second conductive layer 32 may include copper or the like.

Figure 3:
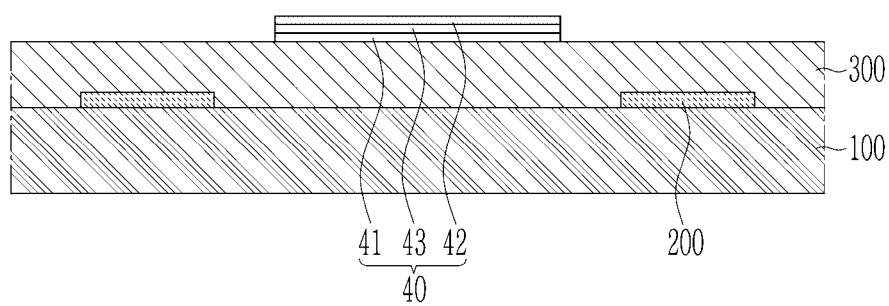

As shown in FIG. 3, a portion of the mask layer ML is etched to form an anti-etching layer 40.

The anti-etching layer 40 is disposed on the first conductive member 41 formed by etching the first conductive layer 31, a second conductive member 42 disposed on the first conductive member 41 and formed by etching the second conductive layer 32, and a release member 43 disposed between the first conductive member 41 and the second conductive member 42. Such an anti-etching layer 40 may prevent etching of the second insulation layer 300 due to a laser beam L in a subsequent laser processing process.

Figure 4:
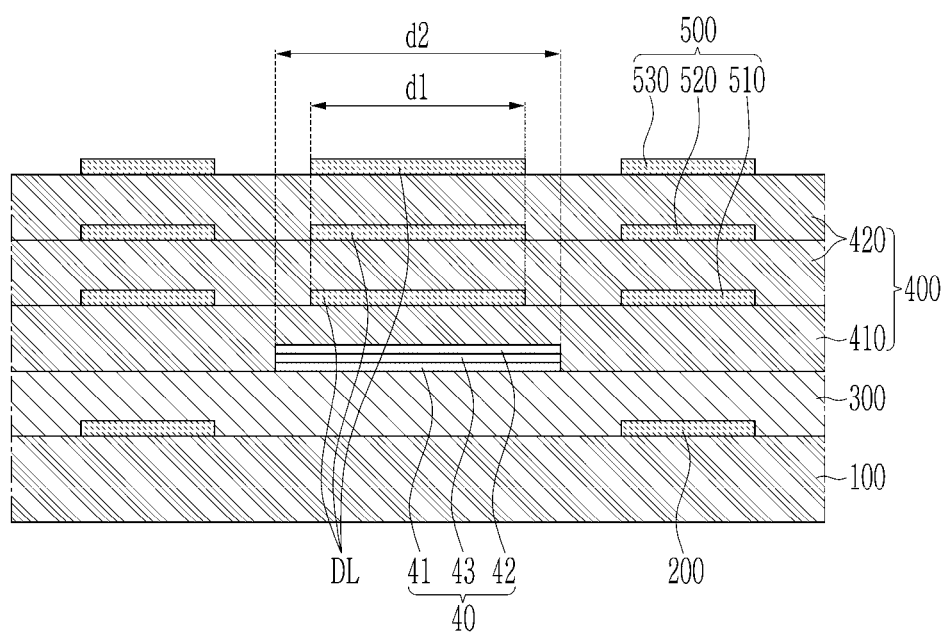

As shown in FIG. 4, a lower insulation layer 410 covering the anti-etching layer 40 is formed on the second insulation layer 300. Then, a second circuit wire 510 and a dummy wire DL are formed on the lower insulation layer 410. The dummy wire DL may include the same material as the second circuit wire 510.

The dummy wire DL may overlap with the anti-etching layer 40. A width d1 of the dummy wire DL may be smaller than a width d2 of the anti-etching layer 40. Therefore, in the subsequent process, when a cutout 400a is formed on the third insulation layer 400 by the laser beam L, the laser processing process can be facilitated because the dummy wire DL does not need to be processed by the laser beam L.

In addition, at least one upper insulation layer 420, the second circuit wires 520 and 530, and the dummy wire DL may be repeatedly stacked on the lower insulation layer 410. In the present embodiment, two upper insulation layers 420 are formed, but it is not limited thereto, and various numbers of upper insulation layers 420 may be formed.

A depth of the cavity CA can be adjusted by adjusting the number of the upper insulation layers 420. That is, the depth of cavity CA may be increased by increasing the number of upper insulation layers 420.

Figure 5:
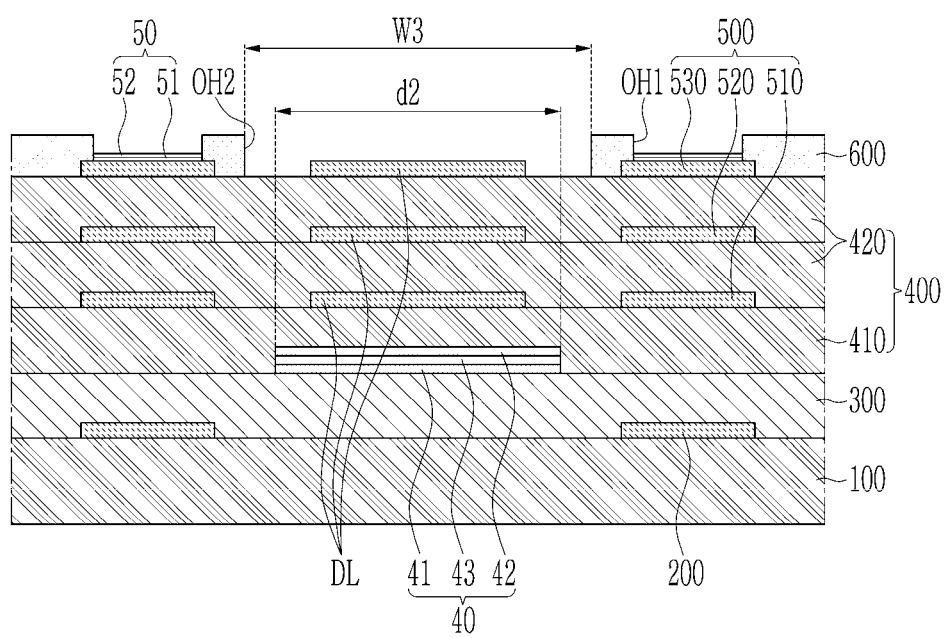

As shown in FIG. 5, a solder resist layer 600 that includes a first opening OH1 and a second opening OH2 is formed on the upper insulation layer 420. The first opening OH1 may overlap the second circuit wire 500, and the second opening OH2 may overlap the dummy wire DL. In particular, the dummy wire DL may be disposed while overlapping the second opening OH2. The first opening OH1 and the second opening OH2 may be formed by performing processes such as exposure, curing, and development on the solder resist layer 600 using a mask. In this case, a width W3 of the second opening OH2 may be greater than the width d2 of the anti-etching layer 40. Then, a plating process, which is a surface treatment process, is performed on the conductive pad 530, which is the uppermost second circuit wire 530, to form an auxiliary pad 50 including a lower auxiliary layer 51 and an upper auxiliary layer 52.

Figure 6:
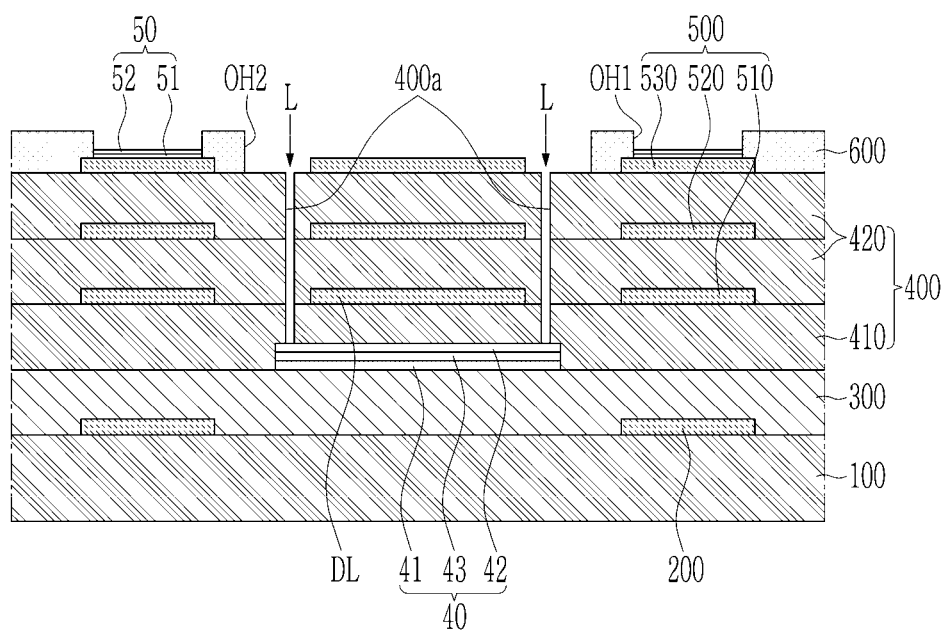

As shown in FIG. 6, a cutout 400a that penetrates the third insulation layer 400 is formed at a position overlapping the second opening OH2 using a laser processing process. That is, a cutout 400a is formed by processing the third insulation layer 400 using the laser beam L, and the lower insulation layer 410 is cut until the upper surface of the second conductive member 42 of the anti-etching layer 40 is exposed. Such an anti-etching layer 40 may serve to block excessive cutting to the second insulation layer 300 by the laser beam L.

Figure 7:
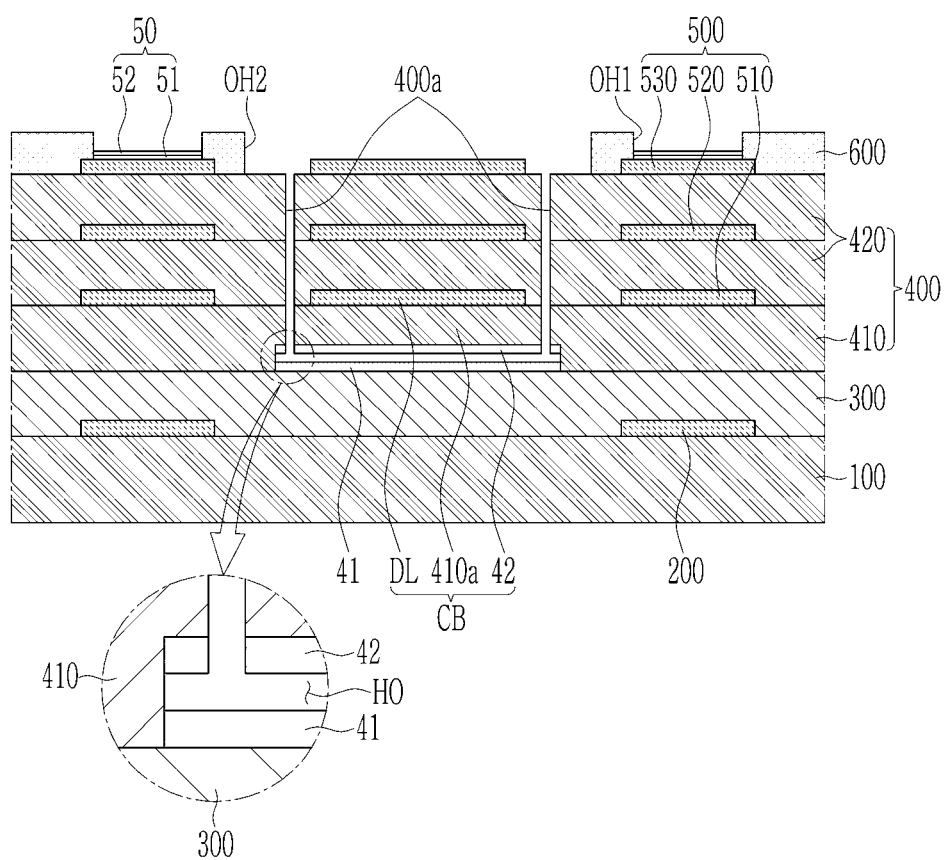

As shown in FIG. 7, the release member 43 of the anti-etching layer 40 is removed by inflowing a first etching solution through the cutout 400a using the etching process. Therefore, an empty space HO is generated at a position of the removed release member 43, and thus the first conductive member 41 and the second conductive member 42 can be separated. In this case, a cavity block CB separated from the third insulation layer 400 is formed.

The cavity block CB may include a second conductive member 42, an insulation block 410a disposed on the second conductive member 42 and separated from the third insulation layer 400 by the cutout 400a, and a dummy wire DL disposed within the insulation block 410a.

Figure 8:
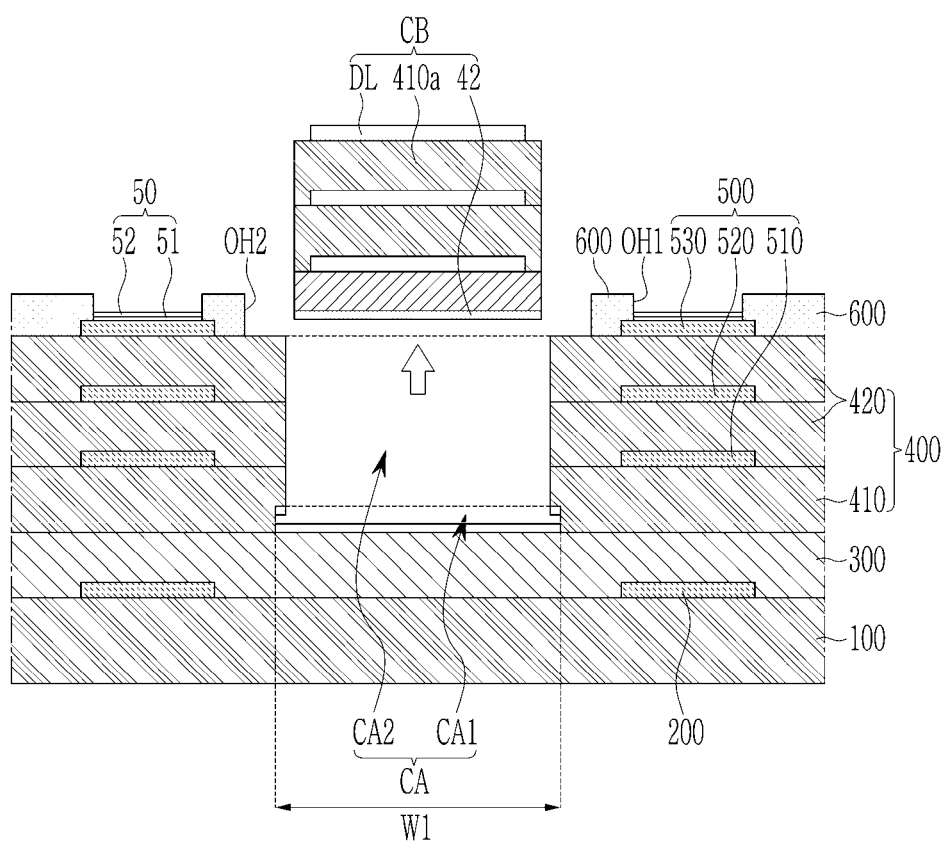

As shown in FIG. 8, the cavity block CB is removed by pulling it upward using vacuum, adsorption, or an adhesive. Therefore, a part of the second cavity CA2 and the first cavity CA1 are formed at a position where the cavity block CB was disposed.

As shown in FIG. 1, both the first cavity portion CA1 and the second cavity CA2 are formed by removing the rest of the first conductive member 41 and the second conductive member 42 on the second insulation layer 300 using a second etching liquid.

As such, in the manufacturing method of the circuit board according to an embodiment, the anti-etching layer is formed to prevent excessive processing of the insulation layer by the laser beam, and the cavity is formed by using a cutout formed on the insulation layer by using the laser beam such that productivity can be improved compared to forming the cavity in the insulation layer only with the laser beam.

In addition, since the anti-etching layer is completely removed using an etching liquid, no residue is left, and the cavity can be formed neatly and easily.

Meanwhile, in the embodiment, the process of removing the rest of the first conductive member and the second conductive member using the second etching liquid is additionally required, but another embodiment in which both the first conductive member and the second conductive member are removed using only the first etching liquid is also possible.

Hereinafter, referring to FIG. 9 together with FIG. 1 to FIG. 6, a manufacturing method of a circuit board according to another embodiment is described in detail.

Figure 9:
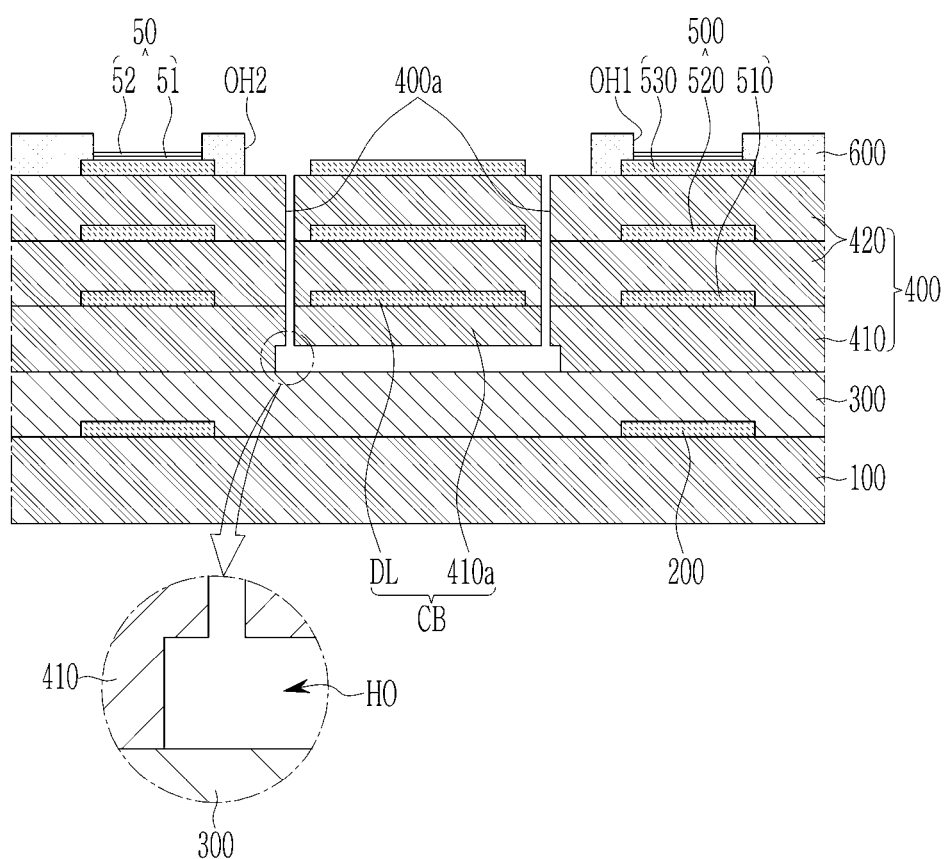
FIG. 9 is a cross-sectional view that shows one step of a manufacturing method of a circuit board according to another embodiment.

FIG. 9 is a cross-sectional view that shows one step of a manufacturing method of a circuit board according to another embodiment.

Compared to the manufacturing method according to the embodiment shown in FIG. 2 to FIG. 8, a manufacturing method according to another embodiment shown in FIG. 9 is substantially equivalent except for removing an anti-etching layer only with a first etching liquid, and therefore repeated explanations are omitted.

As shown in FIG. 2 to FIG. 6, a manufacturing method of a circuit board according to another embodiment forms a first circuit wire 200 on a first insulation layer 100. Then, a mask layer ML covering the first circuit wire 200 is formed, and an anti-etching layer 40 is formed by etching a part of the mask layer ML. Then, a lower insulation layer 410 covering the anti-etching layer 40 is formed on the second insulation layer 300, and a second circuit wire 510 and a dummy wire DL are formed on the lower insulation layer 410. In addition, at least one upper insulation layer 420, second circuit wires 520 and 530, and the dummy wire DL may be repeatedly stacked on the lower insulation layer 410. Then, a solder resist layer 600 having a first opening OH1 and a second opening OH2 is formed on the upper insulation layer 420. Then, a plating process, which is a surface treatment process, is performed on a conductive pad 530, which is the uppermost second circuit wire 530, to form an auxiliary pad 50 including a lower auxiliary layer 51 and an upper auxiliary layer 52. Then, a cutout 400a penetrating a plurality of third insulation layers 400 is formed at a position overlapping the second opening OH2 by using a laser processing process.

As shown in FIG. 9, the anti-etching layer 40 is removed by inflowing a first etching solution through the cutout 400a using an etching process. That is, a first conductive member 41, a second conductive member 42, and a release member 43 that form the anti-etching layer 40 are all removed by sufficient inflow of the first etching solution.

Therefore, an empty space HO is generated at a position of the removed anti-etching layer 40, and a cavity block CB separated from the third insulation layer 400 and the second insulation layer 300 is formed. The cavity block CB may include an insulation block 410a separated from the third insulation layer 400 by the cutout 400a, and a dummy wire DL disposed within the insulation block 410a.

As shown in FIG. 1, a cavity CA is formed by removing the cavity block CB at the position where cavity block CB was disposed.

As described, a process of removing the rest of the first conductive member 41 and the second conductive member 42 using a second etching solution is not additionally required by removing all of the anti-etching layer 40 with only the first etching solution, thereby simplifying the manufacturing process.

In addition, the cavity block CB may be easily removed without using vacuum adsorption or an adhesive.

While this disclosure has been described in connection with what is presently considered to be practical embodiments, it is to be understood that the disclosure is not limited to the disclosed embodiments. On the contrary, it is intended to cover various modifications and equivalent arrangements included within the spirit and scope of the appended claims.

What is claimed is:
1. A circuit board comprising:
a first insulation layer;
a first circuit wire that is disposed on the first insulation layer;
a second insulation layer that covers the first insulation layer and the first circuit wire, and includes a material that is different from that of the first insulation layer; and
a third insulation layer that is disposed on the second insulation layer and includes a cavity,
wherein a bottom surface of the cavity is a portion of a top surface of the second insulation layer,
the cavity comprises:
a first cavity portion that is adjacent to the second insulation layer; and a second cavity portion that communicates with the first cavity portion and is disposed on the first cavity portion, and a width of the first cavity portion is wider than a width of the second cavity portion.

2. The circuit board of claim 1, wherein the third insulation layer includes a plurality of layers, and the circuit board further comprises a second circuit wire that is disposed between the plurality of layers of the third insulating layer.

3. The circuit board of claim 2, wherein the third insulation layer comprises:

a lower insulation layer that is in contact with the second insulation layer and includes the first cavity and a portion of the second cavity, and at least one upper insulation layer that is disposed on the lower insulation layer and includes another portion of the second cavity.

4. The circuit board of claim 3, wherein the second circuit wire is spaced apart from an interface between the second insulating layer and the lower insulating layer.

5. The circuit board of claim 2, further comprising a solder resist layer that is disposed on the third insulation layer, wherein the solder resist layer includes a first opening overlapping the second circuit wire and a second opening overlapping the cavity.

6. The circuit board of claim 5, wherein a width of the second opening is greater than a width of the second cavity.

7. The circuit board of claim 1, wherein the third insulation layer comprises a plurality of layers having the same material as the first insulation layer.

8. The circuit board of claim 7, wherein the first insulation layer and the third insulation layer comprise prepregs, and the second insulation layer contains a resin that does not contain glass fibers.

9. The circuit board of claim 1, wherein a sidewall and the bottom surface of the cavity include only an insulating material.

* * * * *